United States Patent [19]
Shin et al.

[11] Patent Number: 5,737,049
[45] Date of Patent: Apr. 7, 1998

[54] LIQUID CRYSTAL DISPLAY DEVICE HAVING STORAGE CAPACITORS OF INCREASED CAPACITANCE AND FABRICATION METHOD THEREFOR

[75] Inventors: Woo Sup Shin, Kyongki-do; In Duk Song, Seoul, both of Rep. of Korea

[73] Assignee: LG Electronics, Inc., Seoul, Rep. of Korea

[21] Appl. No.: 519,250

[22] Filed: Aug. 25, 1995

[30] Foreign Application Priority Data

May 9, 1995 [KR] Rep. of Korea ............ 95-11261

[51] Int. Cl.⁶ .................. G02F 1/1333; G02F 1/1343
[52] U.S. Cl. .................. 349/122; 349/138; 349/39; 257/59
[58] Field of Search .................. 359/59, 60, 79; 349/38, 39, 122, 138; 257/72, 59

[56] References Cited

U.S. PATENT DOCUMENTS

| | | | |
|---|---|---|---|
| 5,091,337 | 2/1992 | Watanabe et al. | 437/181 |
| 5,151,806 | 9/1992 | Kawamoto et al. | 359/59 |
| 5,231,039 | 7/1993 | Sakono et al. | 437/41 |
| 5,478,766 | 12/1995 | Park et al. | 437/40 |

Primary Examiner—William L. Sikes
Assistant Examiner—Tiep H. Nguyen
Attorney, Agent, or Firm—Michaelson & Wallace; Peter L. Michaelson

[57] ABSTRACT

A liquid crystal display (LCD) device includes: a plurality of gate lines and a plurality of data lines arranged in the form of a matrix; a plurality of transistors each having a gate, a source and a drain, and each disposed at an intersecting point of the lines; a plurality of pixel electrodes connected to the drain electrodes of the respective transistors; and a plurality of capacitors formed on the pixel electrodes. The capacitor includes a capacitor electrode, a gate insulating layer, a semiconductor layer and a protective insulating layer. The semiconductor layer of the capacitor is composed of the same material as that of a semiconductor region of the transistor. An etch stop layer is used for protecting a gate insulating layer during etching a protective insulating layer situated above the gate insulating layer. For the etch stop layer, an amorphous silicon layer or a metal layer are used. By virtue of using the etch stop layer, the capacitor electrodes can be spaced closer together than in conventional LCD devices, thereby advantageously resulting in increased storage capacitance and improved displayed image quality.

24 Claims, 5 Drawing Sheets

LIQUID CRYSTAL DISPLAY DEVICE HAVING STORAGE CAPACITORS OF INCREASED CAPACITANCE AND FABRICATION METHOD THEREFOR

FIELD OF THE INVENTION

The present invention relates to a liquid crystal display device and a formation method therefor, particularly to a method through which a storage capacitor, coupled to a pixel electrode in an active matrix display device, may be accurately formed, and its capacitance.

DESCRIPTION OF THE PRIOR ART

Generally, a conventional TFT LCD (Thin Film Transistor Liquid Crystal Display) device, so-called an active matrix type LCD device, has many pixels arranged in a matrix. A color pixel usually combines three pixels.

Each pixel (cell) has a pixel electrode, a thin film transistor electrically connected to the pixel electrode, and a storage capacitor for holding a signal voltage that is to be applied to the pixel electrode. The thin film transistor has gate, source and drain electrodes and is connected to gate lines and source lines at intersections thereof, with the gate lines each connected to a plurality of gate electrodes and the source lines each connected to a plurality of source electrodes.

The pixel is selected through a data line and a scanning line. To apply a signal voltage to a liquid crystal, the pixel has a TFT and a pixel electrode. The data line is connected to the source (or drain) of a TFT of the pixel; the pixel electrode is connected to a drain (or source) of the TFT, and the scanning line is connected to the gate of the TFT. To select a pixel, signals are supplied to the data line and the scanning line.

As shown in FIG. 1, a pixel having a thin film transistor is formed by the following process.

First, a gate electrode 2 and a storage capacitor electrode 3 are formed upon a transparent substrate 1.

Then, an anodizing process is carried out to form anodized insulating layers 4 and 5 on the surfaces of the gate electrode and the capacitor electrode.

Then, a gate insulator layer 6 is formed on entire surface by chemical vapor deposition process, and an amorphous silicon layer 7 and an n+silicon layer 8 are successively deposited on the gate insulator layer 6. Then, portions of the amorphous silicon layer 7 and the n+silicon layer 8 are removed; remaining portions of the amorphous silicon layer 7 and the n+silicon layer 8 collectively function as a semiconductor TFT.

Then, a conductive layer is formed on the n+silicon layer 8 by a sputtering process, and, in turn, patterned to form a source 9 and a drain 10 electrodes.

After patterning of the source and drain, a dry etching is carried out to remove a portion of the n+layer 8 to form a TFT channel region by using the patterns of the source and drain as a mask.

Then, a chemical vapor deposition method is carried out to deposit a protective insulating layer 11, and then, a contact hole 12 is opened for connecting the drain 10 to a pixel electrode.

Then, a sputtering process is carried out to form a transparent conductive layer (composed of, e.g., ITO (Indium Tin Oxide)), and the transparent conductive layer is patterned to form a transparent electrode 14 (the pixel electrode). This pixel electrode 14 is connected through the contact hole 12 to the drain 10. A portion of the pixel electrode functions as a storage electrode of the storage capacitor—the latter formed in conjunction with capacitor electrode 3 and the layers intervening between these two electrodes.

The pixel of TFT LCD formed as explained above is briefly described as to its operation.

If a scanning signal is supplied to the scanning line (gate line), then the TFT is turned on, so that a data signal incoming through the signal line (data line), and connected, e.g., to source 9, would be transmitted through the channel to drain 10 and the pixel electrode 14. Consequently, the voltage is supplied to the liquid crystal to display one pixel. To provide proper image quality, the data signal which is transmitted to this pixel has to be maintained (i.e., "held") until the next successive data signal is applied. A part which performs the voltage holding function is the storage capacitor.

The picture quality improves if the voltage of the data signals is maintained at the pixel electrode until the next successive data signal voltage is supplied. Therefore, the storage capacitor must have sufficient capacitance to maintain the voltage of this signal from one field period to the next.

The capacitance of the storage capacitor is proportional to an overlapping area between the pixel electrode and the storage capacitor electrode, and inversely proportional to thickness d2 between these two electrodes. Therefore, in forming a capacitor having a sufficient capacitance, the two factors, i.e., the overlapping area and the thickness have to be considered.

To examine a stacked structure inherent in the above described capacitor, the stacking is formed in the order of the capacitor electrode 3 formed on the glass substrate, the anodized insulating layer 5, the gate insulating layer 6, the protective insulating layer 11 and the pixel electrode 14.

Therefore, in order to form a relatively large storage capacitance, the area of the capacitor electrode 3 needs to increase. However, if the area of the capacitor increases, then an area through which visible light would pass would decrease, with the result that the opening (or aperture) ratio (or light transmittance) would decrease.

Further, one might think that the protective insulating layer could be eliminated in order to reduce the thickness between the two electrodes in order to increase the capacitance. However, the protective insulating layer is generally composed of the same material as that of the gate insulating layer, therefore, it is very difficult to etch only the protective insulating layer without etching into the gate insulating layer. In that regard, if, while etching the protective insulating layer, the gate insulating layer is damaged, then an insulation quality, i.e., dielectric ability, of the capacitor dielectric layer may fail, with the result that a short circuit occurs between the capacitor electrode and the pixel electrode, or a leakage current increased, thus making a final product defective. Therefore, a limit disadvantageously exists in reducing the distance (d2) between these two electrodes.

SUMMARY OF THE INVENTION

The present invention is intended to overcome the above described disadvantages of the conventional technique.

Therefore, an object of the present invention is to provide a liquid crystal display in which the distance between the pixel electrode (for use as one electrode in a storage capacitor) and the capacitor electrode (the other electrode in this capacitor) is reduced, thereby increasing the capacitance of the capacitor.

In achieving this object, the liquid crystal display according to the present invention includes, a plurality of gate lines and a plurality of data lines arranged in a matrix; a plurality of semiconductor thin film transistors (TFTs) each having a gate, a source and a drain, and each disposed at an intersecting point of the lines; a plurality of pixel electrodes, each connected to the drain electrodes of each of these transistors; and a plurality of capacitors each for holding a voltage at each corresponding pixel electrode.

The capacitor comprises a capacitor electrode, a gate insulating layer, a semiconductor layer and a protective insulating layer. The semiconductor layer of the capacitor is composed of the same material as that of a semiconductor TFT region, e.g., amorphous semiconductor and $n^+$ layers, of each semiconductor transistor. Alternatively, the capacitor comprises a capacitor electrode, a gate insulating layer, a metal layer and a protective insulating layer.

An etch stop layer is used for protecting a gate insulating layer during etching a protective insulating layer situated above the gate insulating layer. For the etch stop layer, an amorphous silicon layer or a metal layer are used. By virtue of using the etch stop layer, the capacitor electrodes can be spaced closer together than in conventional LCD devices, thereby advantageously resulting in increased storage capacitance and improved displayed image quality.

One aspect of the present invention is to provide a method for forming a liquid crystal display device, comprising the steps of: forming a gate electrode and a capacitor electrode upon a substrate; anodizing the gate electrode and the capacitor electrode; sequentially forming a gate insulating layer, an amorphous silicon layer and an $n^+$ silicon layer on the gate electrode and on the capacitor electrode, and patterning the amorphous silicon layer and the $n^+$ silicon layer on the gate insulating layer or only on the gate electrode; forming source and drain electrodes on the $n^+$ silicon layer and patterning these electrodes; etching the $n^+$ silicon layer by utilizing the source and drain electrodes as a mask; and depositing protective insulating layers on the entire resulting surface; and finally etching a portion of the protective insulating layer corresponding to a contact hole and a capacitor formation region.

According to another aspect of the present invention, a pixel (cell) of a liquid crystal display (LCD) comprises a transparent pixel electrode for supplying a voltage to a liquid crystal which is encapsulated within a transparent body of the LCD; a switching transistor for supplying a signal voltage to the pixel electrode; and a capacitor for holding the supplied signal voltage even after the transistor has been turned off. The capacitor comprises: a first capacitor electrode formed on a transparent substrate; a capacitor dielectric layer formed on the first capacitor electrode; a second capacitor electrode formed on the capacitor dielectric layer; a capacitor insulating layer for covering only a portion of the second capacitor electrode; and a capacitor pixel electrode electrically connected to a portion of the second electrode that is not covered by the capacitor insulating layer.

A further aspect of the present invention is to provide a method for forming a pixel of a LCD comprising the steps of: forming a gate electrode and a first capacitor electrode upon a transparent substrate; then, forming a gate insulating layer over the entire surface area of the LCD as it then exists; then, forming an amorphous silicon layer and an $n^+$ silicon layer, and patterning the amorphous silicon layer and the $n^+$ silicon layer so as to form a TFT formation region and a capacitor formation region; thereafter, depositing a conductive layer on the entire surface of the LCD as it then exists, and forming patterns of source and drain electrodes by etching the conductive layer; then, etching the $n^+$ silicon layer using the source and drain electrodes as a mask so as to remove the $n^+$ layer of both the TFT formation region and a capacitor formation region; thereafter, depositing a protective insulating layer on the entire surface of the LCD as it then exists, and etching an appropriate portion of the protective insulating layer in order to simultaneously form a contact hole for connecting a pixel electrode to the drain electrode and to form a capacitor pixel electrode portion on the capacitor formation region; and finally, forming a transparent conductive layer on the entire surface of the then existing LCD, and forming a pixel electrode connected to the drain electrode through the contact hole and connected to the capacitor formation region by etching the transparent conductive layer.

When the appropriate portion of the protective insulating layer is etched, the amorphous silicon layer is further etched such that the latter remains. Hence, the gate insulating layer which is disposed underneath the amorphous silicon layer is also etched. Alternatively, only a part of the surface of the amorphous layer may be etched, so that the amorphous silicon layer becomes the second capacitor electrode.

The gate insulating layer and the protective insulating layers are each composed of silicon nitride; the conductive layer is composed of a metal having a large etch selectivity with the silicon layer and the gate insulating layer.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

FIGS. 2A–G are respective sectional views illustrating a pixel (cell) of a liquid crystal display (LCD) device fabricated through a first embodiment of the inventive method.

Figure 1:
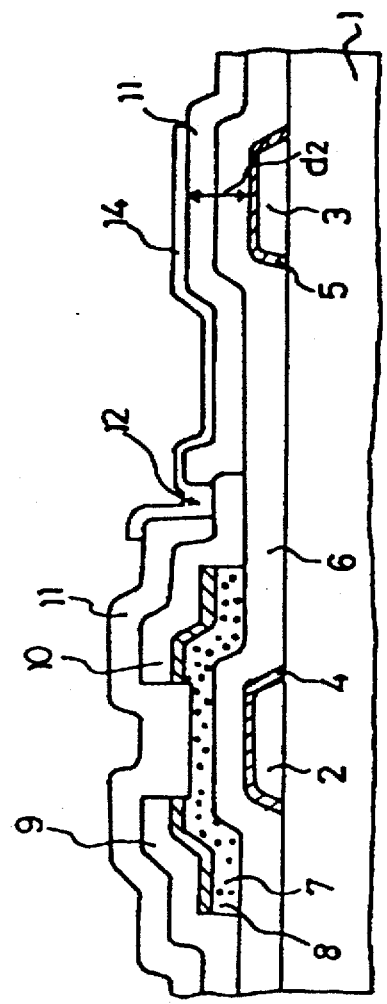
FIG. 1 is a sectional view showing of a pixel to explain a conventional method for forming a liquid crystal display device.
Figure 2A:
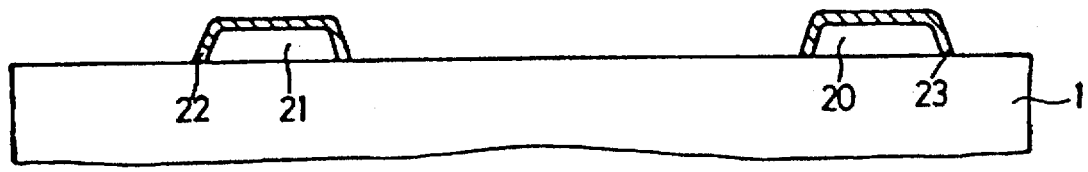
FIGS. 2A–G are sectional views, each taken along the line II—II in FIG. 3, showing successive fabrication steps of an LCD pixel produced through a first embodiment of a method for forming a liquid crystal display device according to the present invention.

First, as shown in FIG. 2A, a conductive layer is formed upon a transparent substrate 1 composed of a material such as glass. Then, a photo etching process (photolithography) is performed to form a pattern of a gate electrode 21 which is used as a scanning line, and a pattern of a first capacitor electrode 20, the capacitor being used as a voltage maintaining means. This capacitor electrode can be formed specifically for the purpose, but generally, for ease of manufacture, a gate electrode of an adjacent pixel is utilized for the capacitor electrode. Such utilization will be assumed and is valid throughout the remaining discussion. For forming the conductive layer, a known method such as sputtering or chemical vapor deposition is used.

Then, an anodizing process is performed to form an anodized layer 22 on the surface of the gate electrode 21. An anodized layer 23 is also formed on the first capacitor electrode 20 which is the gate electrode of an adjacent pixel.

Figure 2B:
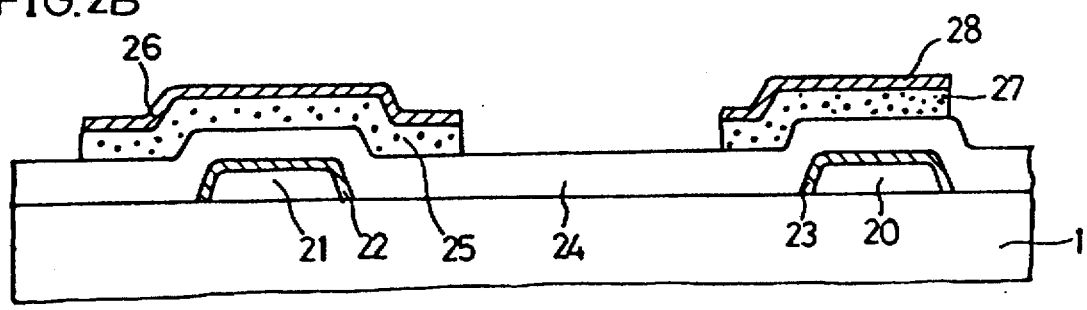

Then, as shown in FIG. 2B, a plasma enhanced chemical vapor deposition process (PECVD) is performed to form a gate insulating layer 24 on the entire surface. Thereupon, an amorphous silicon layer and $n^+$ doped silicon layer are successively formed, and patternized by a photo etching process. Thus, there are formed a pattern of an amorphous silicon layer 25 and an $n^+$ silicon layer 26 of a thin film transistor (TFT) formation region 43 and a pattern of an amorphous layer 27 and an $n^+$ silicon layer 28 of a capacitor formation region 45. Here, the gate insulating layer 24 is composed of silicon nitride, and the $n^+$ silicon layer is formed by depositing appropriately doped silicon by chemical vapor deposition or ion implantation over the amorphous silicon layer 25.

Figure 2C:
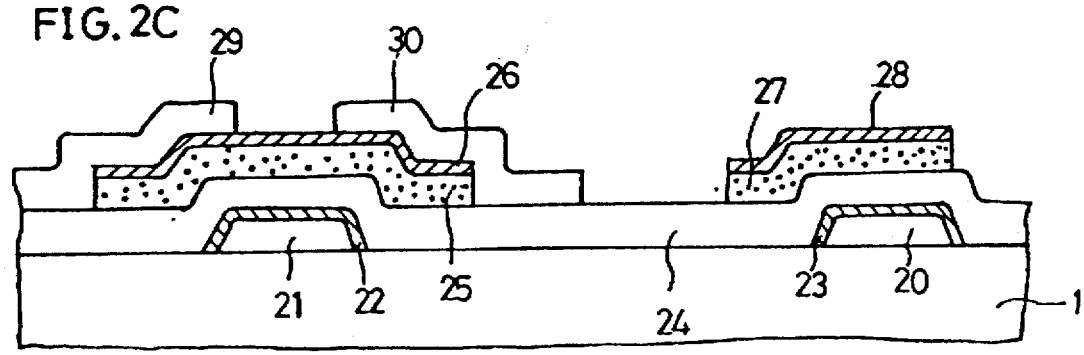

Then, as shown in FIG. 2C, a conductive layer is formed by sputtering and then patterning to form a source electrode 29 and a drain electrode 30.

Figure 2D:
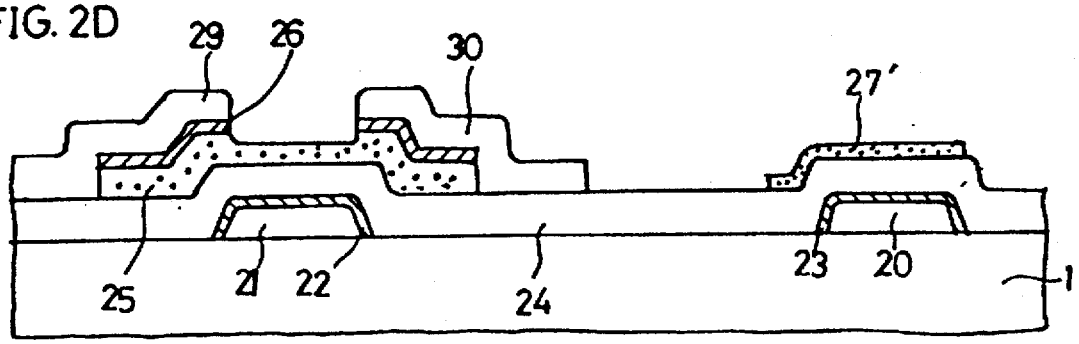

Thereafter, as shown in FIG. 2D, using the source electrode 29 and the drain electrode 30 as a mask, a portion of the $n^+$ silicon layer 26 of TFT formation region is removed by dry etching. Also, during this etching process, the $n^+$ silicon layer 28 of the capacitor formation region is entirely removed, as is a portion of the amorphous silicon layer 27. The resulting thickness of the amorphous silicon layer 27' of the capacitor formation region is approximately 1000 Angstroms.

Figure 2E:
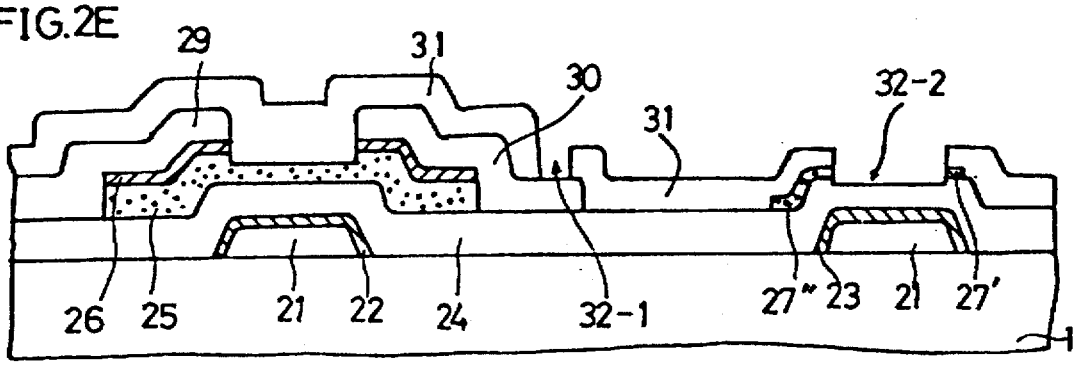

Then, as shown in FIG. 2E, a protective insulating layer 31 is deposited by chemical vapor deposition. Subsequently, an appropriate pre-defined portion of the protective insulating layer is etched by photo etching process in order to open a contact hole 32-1; this hole being used to connect a pixel electrode to the drain electrode 30. Simultaneously, another appropriate pre-defined portion 32-2 of the protective insulating layer and, as discussed below, amorphous silicon layer 27' for forming a storage capacitor pixel electrode, i.e., a second capacitor electrode, over the first capacitor electrode of the capacitor formation region is opened.

Here, the protective insulating layer 31 is composed of a material, illustratively silicon nitride, having a large etch selectivity with the amorphous silicon layer which is disposed immediately below. If there were no amorphous silicon layer, then, since the material of the gate insulating layer 24 would be the same as the protective insulating layer 31, the time for etching only the protective insulating layer 31 could not readily be detected. Thus, if the etching were excessive, the gate electrode will be exposed, or alternatively the etching may be insufficient.

Generally, the gate insulating layer 24 and the protective insulating layer 31 are composed of the same material, e.g., silicon nitride. Therefore, when a material (amorphous silicon in this embodiment) of the intermediate layer which is disposed between layers 24 and 31 is selected, the material should preferably have a large etch selectivity with the two layers.

Etching of this protective insulating layer is carried out in the following manner. A dry etching is performed until an etch end point is detected. This point is detectable based on the fact that a nitrogen gas byproduct produced during the etching of the silicon nitride differs from a byproduct produced during the etching of the amorphous silicon layer disposed immediately therebelow.

Figure 4:
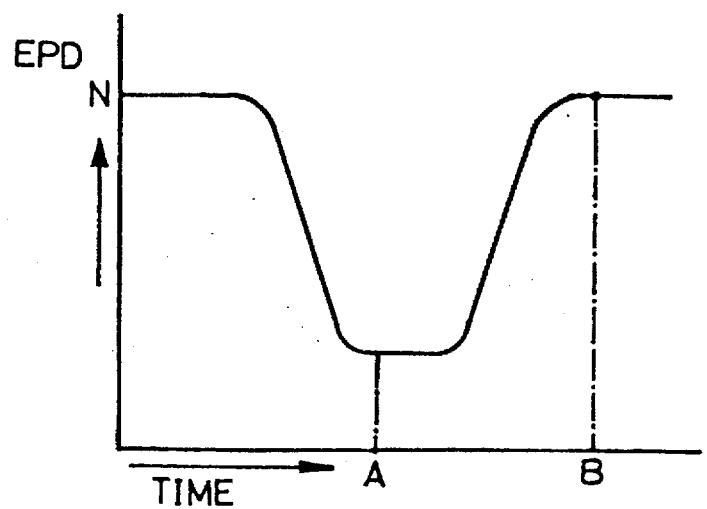
FIG. 4 is a graphical illustration showing a method for detecting an etch end point during a dry etching process.

In order to explain the etching process, FIG. 4 shows nitrogen generation rate versus etching time. For ease of understanding, the reader should simultaneously refer to FIGS. 2E and 4 throughout the following discussion. When the protective layer 31 is etched, the nitrogen generation rate remains substantially constant during an initial period. At a time A, when the protective insulating layer 31 has all been etched, the amorphous silicon layer begins to be etched. At a time B, the amorphous silicon layer has been etched, and the gate insulating layer which is disposed under the amorphous silicon layer begins to be etched.

As shown in FIG. 2E, in the present embodiment, the etching is stopped at the time B of FIG. 4 after completely removing the amorphous silicon layer 27' of the portion 32-2 to leaving a edge region 27" of the amorphous silicon layer 27' and a surface of the gate insulating layer, thereby increasing the capacitance of the storage capacitor. Hence, the amorphous silicon layer acts as an etch stop layer, i.e. etching halts once this layer is completely etched away to expose the gate insulating layer situated immediately therebelow. As noted previously, the etch stop layer can, alternately be a metallic layer, the same, for example, used to form the source and drain electrodes 29 and 30.

Figure 2F:
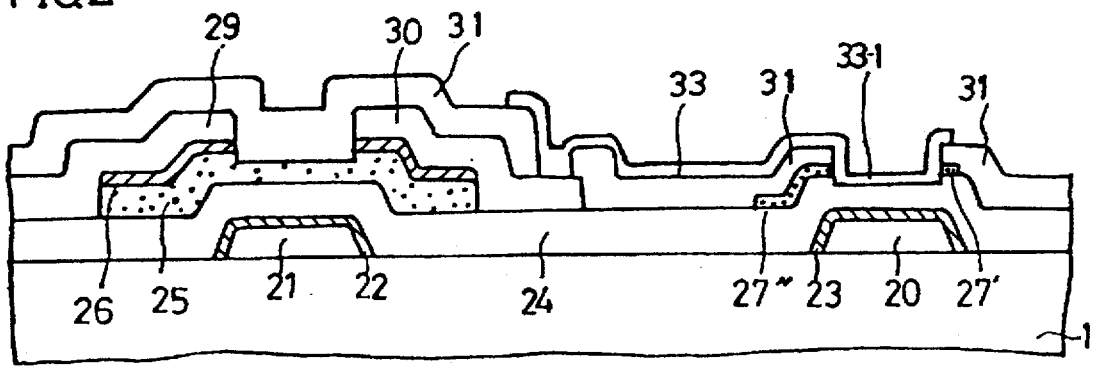
Figure 2G:
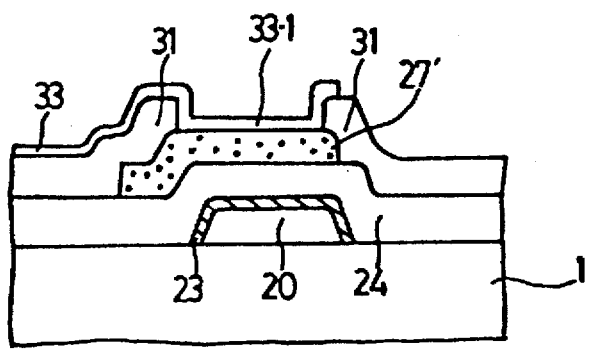

In another embodiment, as shown in FIG. 2G, the etching process is stopped at the time A (shown in FIG. 4) after only the protective insulating layer 31 is etched, hence, leaving the amorphous silicon layer 27' intact. Thus, the amorphous silicon layer 27' remains for use as a storage capacitor electrode, i.e., a second electrode, of the storage capacitor.

After patterning the protective insulating layer 31 in order to form a pixel electrode and a second capacitor electrode, as shown in FIG. 2F, a transparent conductive layer of indium tin oxide (ITO) is deposited on the entire surface, and then a patterning process is performed. Consequently, the pixel electrode 33 is connected to the drain electrode 30 through the contact hole 32-1 (see FIG. 2E). Further, as shown in FIG. 2F, a capacitor pixel electrode 33-1 is connected to the amorphous silicon layer 27" which remains in the form of a rectangular rim, with the result that the capacitor pixel electrode 33-1 together with the amorphous silicon layer 27" serves as a second capacitor electrode (27" and 33-1).

In the other embodiment shown in FIG. 2G, the capacitor pixel electrode 33-1 and the amorphous silicon layer 27' are connected together, with the result that the second capacitor electrode is electrically connected to the pixel electrode.

After the above described processes, a conventional process is carried out to complete the pixel and the TFT LCD.

Figure 3:
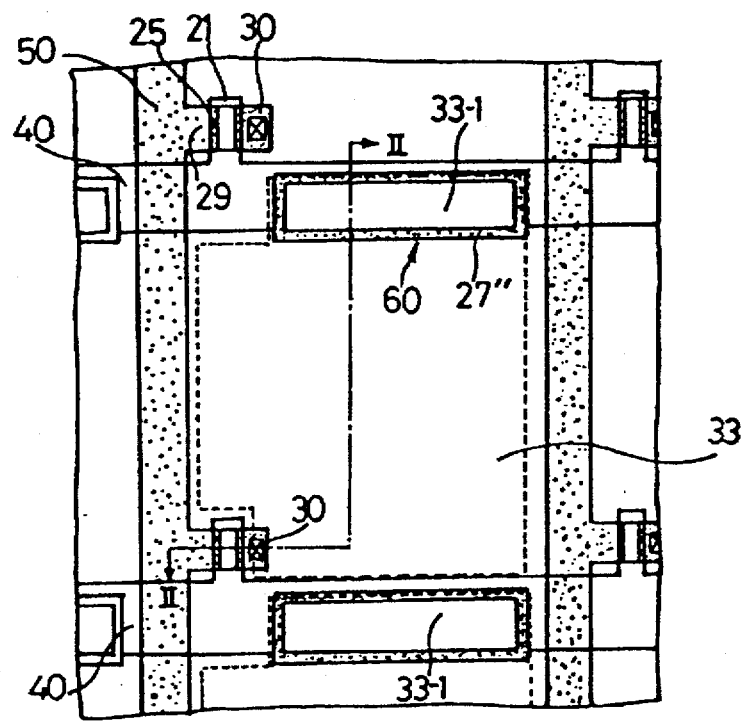
FIG. 3 illustrates the layout of the liquid crystal display device of the first embodiment of the present invention.

The layout of the pixel formed as described above according to the present invention is as shown in FIG. 3.

Signal lines 50 and scanning lines 40 are arranged in a matrix. Further, the gate electrode 21 is a part of the scanning line 40, and the source 29 is a part of the signal line 50. Further, the drain 30 is connected to the pixel electrode 33, and the capacitor pixel electrode 33-1 is formed on a part of the pixel electrode 33. Further, the storage capacitor is formed on a portion which is indicated by a reference number 60. A gate electrode of an adjacent pixel passes under the second capacitor electrode 27" and 33-1.

In the pixel manufactured based on the above described method according to the present invention, the storage capacitor is composed of the first capacitor electrode 20 and the second capacitor electrode 27" and 33-1 which, though opposed to each other, are separated by a smaller thickness than that of the gate insulating layer 24. Therefore, the capacitance of the resulting storage capacitor is increased compared with that of the conventional capacitor. Additionally, in the embodiment of FIG. 2G, the storage capacitor is composed of the first electrode 20 and the second electrode 27', though opposed to each other, but here separated only by the gate insulating layer 24. Therefore, the capacitance of the resulting storage capacitor, shown in FIG. 2G, is also increased as compared with that of the conventional capacitor.

Figure 5:
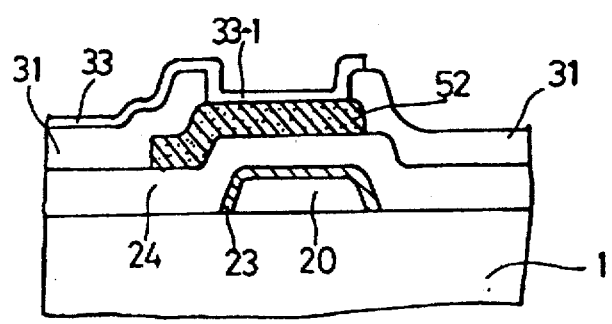
FIG. 5 is a sectional view showing an LCD pixel produced through a second embodiment of the method for forming a liquid crystal display device according to the present invention.

FIG. 5 is a sectional view showing the storage capacitor region of a second embodiment of the present invention. This embodiment will be described with simultaneous reference to FIGS. 2A–G and 5.

At first, similar to the first embodiment of FIG. 2, a conductive layer is formed upon a transparent substrate 1 composed of a material such as glass. Then, a photo-etching process is carried out to form a pattern of a gate electrode 21 to be used as a scanning line, and a pattern of a first capacitor electrode 20 to be used as a voltage holding means. The first capacitor electrode also serves as the gate electrode of an adjacent pixel. Then, an anodizing process is carried out to form an anodized layer 22 on the surface of the gate electrode. An anodized layer 23 is also formed on the first capacitor electrode.

Then, a chemical vapor deposition process is carried out to form a gate insulating layer 24 on the entire surface. Thereupon, an amorphous silicon layer and an n$^+$doped silicon layer are successively formed. Then, a photo-etching process is carried out to pattern the amorphous silicon and the n$^+$silicon layers. Thus, there are formed an amorphous layer 25 and n$^+$silicon layer 26 of a TFT formation region (not shown in FIG. 5). Here, an amorphous silicon layer or an n$^+$silicon layer are not separately formed on the capacitor electrode region shown in FIG. 5.

Then, a sputtering process is carried out to form a conductive layer, and then, a source electrode 29, a drain electrode 30, and a second capacitor electrode (second conductive layer) 52 in the capacitor region are patterned by etching the conductive layer. The source electrode 29, the drain electrode 30 and the second capacitor electrode 52 are composed of a conductive material having a large etch selectivity with silicon and gate insulating layer 24 which is disposed below. For example, a metal such as aluminum, or a material such as ITO can be used. The thickness of the second conductive layer may be same as that of the amorphous silicon layer 27 of FIG. 2B.

Then, a dry etching is carried out on the n$^+$silicon layer 26 by utilizing the patterns of the source electrode 29 and the drain electrode 30 as a mask, thereby removing the n$^+$silicon layer on a portion of a TFT channel region. Thus, a TFT is formed as shown in the left side portion of FIG. 2D.

Then, a protective insulating layer 31 is deposited by a chemical vapor deposition process, and then, an appropriate portion of the protective insulating layer is etched by photo-etching, so that a contact hole 32-1 is opened for connecting the pixel electrode to the drain electrode. Further, a capacitor pixel electrode portion 32-2 above the second capacitor electrode is opened. Here, the protective insulating layer is composed of a material having a large etch selectivity with the conductive layer which is disposed below. An example of this material is silicon nitride. This etching process is terminated at the time A of FIG. 4, so that the protective insulating layer composed of silicon nitride can be patterned.

Thereafter, in order to form the pixel electrode, a transparent conductive layer (ITO) is deposited on the entire surface, and then, patterned. Consequently, the pixel electrode 33 is connected to the drain electrode 30 through the contact hole. Further, a capacitor pixel electrode 33-1 as a part of the pixel electrode 33 is connected to the capacitor conductive layer 52.

After the above described process steps, the conventional process is performed to complete the pixel and the TFT LCD.

The layout of the pixel formed as described above according to the present invention becomes as shown in FIG. 3.

The pixel of the liquid crystal display device formed in the above-described manner according to the present invention includes: a transparent pixel electrode 33 for supplying a voltage potential to a liquid crystal; a switching TFT transistor for supplying a signal voltage to the pixel electrode, and having a source electrode 29, a gate electrode 21 and a drain electrode 30 which is connected to the pixel electrode; and a capacitor for holding the supplied signal voltage after the TFT transistor is turned off. The storage capacitor includes: a first electrode 20 (capacitor electrode) formed on the substrate; a capacitor dielectric layer 24 as a gate insulating layer formed on the first electrode; a second electrode 27' (or 52), 33-1 formed on the capacitor dielectric layer; a protective insulating layer 31 for covering only edges of the second capacitor electrode; and a pixel electrode 33 electrically connected to a portion of the second electrode not covered by the insulating layer 31.

The second electrode which is formed on the capacitor dielectric layer is composed of the same material as that of the pixel electrode and is formed on the portion of the capacitor dielectric layer not covered by the insulating layer. Alternatively, the second electrode is formed as a conductive layer on the capacitor insulating layer but composed of a material that differs from that of the pixel electrode.

The first (capacitor) electrode, which is formed below the capacitor dielectric layer, is composed of either the same material as that of the semiconductor layer of the TFT, or the same metal as that of the source and drain electrodes.

According to the present invention as described above, the storage capacitor is constituted such that the first and second capacitor electrodes are opposed to each other but separated by a thickness less than the thickness of the gate insulating layer, and therefore, imparting increased capacitance to the storage capacitor.

What is claimed is:

1. A method for forming a storage capacitor in a liquid crystal display (LCD) device, said device having a pixel electrode situated on a protective layer, comprising the steps of:

first forming a first capacitor electrode upon a substrate;

second forming, in sequence, an insulating layer, an amorphous silicon layer and the protective layer above said first capacitor electrode, said amorphous silicon layer being an etch stop layer;

etching said protective and amorphous silicon layers so as to form etched layers; and third forming a conductive layer, over said etched layers, as a second capacitor electrode so as to form the storage capacitor and connecting the second capacitor electrode to the pixel electrode.

2. The method of claim 1 wherein the etching step further comprises the step of etching the protective and amorphous silicon layers so as to expose a pre-defined area of the insulating layer situated above the first capacitor electrode.

3. The method of claim 2 wherein the second forming step comprises the step of forming the amorphous silicon layer simultaneously with a formation of an amorphous silicon layer of a thin film transistor in said LCD device.

4. The method of claim 3 further comprising the step of anodizing the first capacitor electrode, so as to form an anodized layer on a surface of the first capacitor electrode, prior to forming the insulating layer.

5. A method for forming a storage capacitor in a liquid crystal display (LCD) device, said device having a pixel electrode situated on a protective layer, comprising the steps of:

forming a first capacitor electrode upon a substrate;

forming, in sequence, an insulating layer, an amorphous silicon layer and the protective layer above said first capacitor electrode; said amorphous silicon layer being an etch stop layer;

etching said protective layer so as to form an etched layer; and forming a conductive layer, over said etched layer, as a second capacitor electrode so as to form the storage capacitor and connecting the second capacitor electrode to the pixel electrode.

6. The method of claim 5 wherein the etching step further comprises the step of etching the protective layer so as to expose a pre-defined area of the amorphous silicon layer.

7. The method of claim 6 wherein the second forming step comprises the step of forming the amorphous silicon layer simultaneously with a formation of an amorphous silicon layer of a thin film transistor in said LCD device.

8. The method of claim 7 further comprising the step of anodizing the first capacitor electrode, so as to form an anodized layer on a surface of the first capacitor electrode, prior to forming the insulating layer.

9. A method for forming a storage capacitor in a liquid crystal display (LCD) device, said device having a pixel electrode situated on a protective layer, comprising the steps of:

first forming a first capacitor electrode upon a substrate;

second forming, in sequence, an insulating layer, a first conductive layer as an etch stop layer, and the protective layer above said first capacitor electrode;

etching said protective layer so as to form an etched layer; and third forming a second conductive layer, over said etched layer and connected to the first conductive layer, as a second capacitor electrode so as to form the storage capacitor and connecting said second capacitor electrode to the pixel electrode.

10. The method of claim 9 wherein the second forming step comprises the step of forming the first conductive layer as a conductive metallic layer simultaneously with a formation of source and drain electrodes of a thin film transistor in said LCD device.

11. The method of claim 10 wherein the etching step further comprises the step of etching the protective layer so as to expose a pre-defined area of the first conductive layer situated on the insulating layer above the first capacitor electrode.

12. The method of claim 11 further comprising the step of anodizing the first capacitor electrode, so as to form an anodized layer on a surface of the first capacitor electrode, prior to forming the insulating layer.

13. A liquid crystal display (LCD) device having a storage capacitor connected to a pixel electrode formed on a protective layer, the storage capacitor having a first electrode situated on a substrate, the capacitor comprising:

an insulating layer, an amorphous silicon layer and the protective layer which are successively formed above said first capacitor electrode, wherein the amorphous silicon layer is an etch stop layer;

the protective and amorphous silicon layers are etched so as to form etched layers; and a conductive layer is formed, over the etched layers, as a second capacitor electrode of the storage capacitor and connected to the pixel electrode.

14. The LCD device of claim 13 wherein the protective and amorphous silicon layers are both etched so as to expose a pre-defined area of the insulating layer situated above the first capacitor electrode.

15. The LCD device of claim 14 wherein the amorphous silicon layer is formed simultaneously while an amorphous silicon layer of a thin film transistor is being formed in the LCD device.

16. The LCD device of claim 15 wherein an anodized layer is formed on a surface of the first capacitor electrode prior to forming the insulating layer.

17. A liquid crystal display (LCD) device having a storage capacitor connected to a pixel electrode formed on a protective layer, the storage capacitor having a first electrode situated on a substrate, the capacitor comprising:

an insulating layer, an amorphous silicon layer and the protective layer which are successively formed above said first capacitor electrode, wherein the amorphous silicon layer is an etch stop layer;

the protective layer is etched so as to form an etched layer; and a conductive layer is formed, over the etched layer, as a second capacitor electrode of the storage capacitor and connected to the pixel electrode.

18. The LCD device of claim 17 wherein the protective layer is etched so as to expose a pre-defined area of the amorphous silicon layer.

19. The LCD device of claim 18 wherein the amorphous silicon layer is formed simultaneously while an amorphous silicon layer of a thin film transistor is being formed in the LCD device.

20. The LCD device of claim 19 wherein an anodized layer is formed on a surface of the first capacitor electrode prior to forming the insulating layer.

21. A liquid crystal display (LCD) device having a storage capacitor connected to a pixel electrode formed on a protective layer, the storage capacitor having a first electrode situated on a substrate, the capacitor comprising:

an insulating layer, a first conductive layer as an etch stop layer, and the protective layer successively formed above said first capacitor electrode;

the protective layer being etched so as to form an etched layer; and a second conductive layer being formed, over the etched layer, as a second capacitor electrode of the storage capacitor and connected to the pixel electrode.

22. The LCD device of claim 21 wherein the first conductive layer is a conductive metallic layer which is simultaneously formed while source and drain electrodes of a thin film transistor in said LCD device are being formed.

23. The LCD device of claim 22 wherein the protective layer is etched so as to expose a pre-defined area of the first conductive layer situated on the insulating layer above the first capacitor electrode.

24. The LCD device of claim 23 wherein an anodized layer is formed on a surface of the first capacitor electrode prior to forming the insulating layer.

* * * * *